United States Patent
Egan

(10) Patent No.: US 12,190,965 B2
(45) Date of Patent: Jan. 7, 2025

(54) CODING TO DECREASE ERROR RATE DISCREPANCY BETWEEN PAGES

(71) Applicant: Micron Technology, Inc., Boise, ID (US)

(72) Inventor: Curtis Egan, Brighton, CO (US)

(73) Assignee: Micron Technology, Inc., Boise, ID (US)

( * ) Notice: Subject to any disclaimer, the term of this patent is extended or adjusted under 35 U.S.C. 154(b) by 198 days.

(21) Appl. No.: 17/894,398

(22) Filed: Aug. 24, 2022

(65) Prior Publication Data

US 2024/0071518 A1   Feb. 29, 2024

(51) Int. Cl.
  *G11C 16/26*   (2006.01)
  *G11C 11/56*   (2006.01)

(52) U.S. Cl.
  CPC .......... *G11C 16/26* (2013.01); *G11C 11/5642* (2013.01)

(58) Field of Classification Search
  CPC ... G11C 16/26; G11C 11/5642; G11C 29/021; G11C 29/028; G11C 2029/5002; G11C 7/04; G11C 16/3418; G11C 29/06; G11C 29/4401; G11C 29/52
  See application file for complete search history.

(56) References Cited

U.S. PATENT DOCUMENTS

| | | | | |
|---|---|---|---|---|
| 9,921,749 | B2* | 3/2018 | Kim | G11C 16/26 |
| 2014/0029343 | A1* | 1/2014 | Yasuda | G11C 16/10 |
| | | | | 365/185.24 |
| 2014/0226398 | A1* | 8/2014 | Desireddi | G11C 16/349 |
| | | | | 365/185.03 |
| 2016/0306693 | A1* | 10/2016 | Lin | G11C 29/028 |
| 2019/0304546 | A1* | 10/2019 | Hsiao | G06F 13/1668 |
| 2022/0044752 | A1* | 2/2022 | Kim | G11C 29/021 |
| 2024/0071518 | A1* | 2/2024 | Egan | G11C 16/26 |

* cited by examiner

*Primary Examiner* — Khamdan N. Alrobaie
(74) *Attorney, Agent, or Firm* — Holland & Hart LLP

(57) ABSTRACT

Methods, systems, and devices for coding to decrease error rate discrepancy between pages are described. For example, to identify a unit-distance code for operating a memory device, voltage drifts of a set of read voltages after a duration may be identified and each of the read voltages may be mapped to one of a set of pages of the memory cell using various possible unit-distance codes. Thus, for each unit-distance code the set of pages may be associated with respective subsets of the set of read voltages. Then, for each unit-distance code a set of average read voltage drifts corresponding to one of the set of pages may be identified. The memory device may be operated using a unit-distance code associated with a smaller range of the set of average read voltage drifts than ranges of sets of average read voltage drifts associated with other unit-distance codes.

25 Claims, 9 Drawing Sheets

500

CODING TO DECREASE ERROR RATE DISCREPANCY BETWEEN PAGES

FIELD OF TECHNOLOGY

The following relates to one or more systems for memory, including coding to decrease error rate discrepancy between pages.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
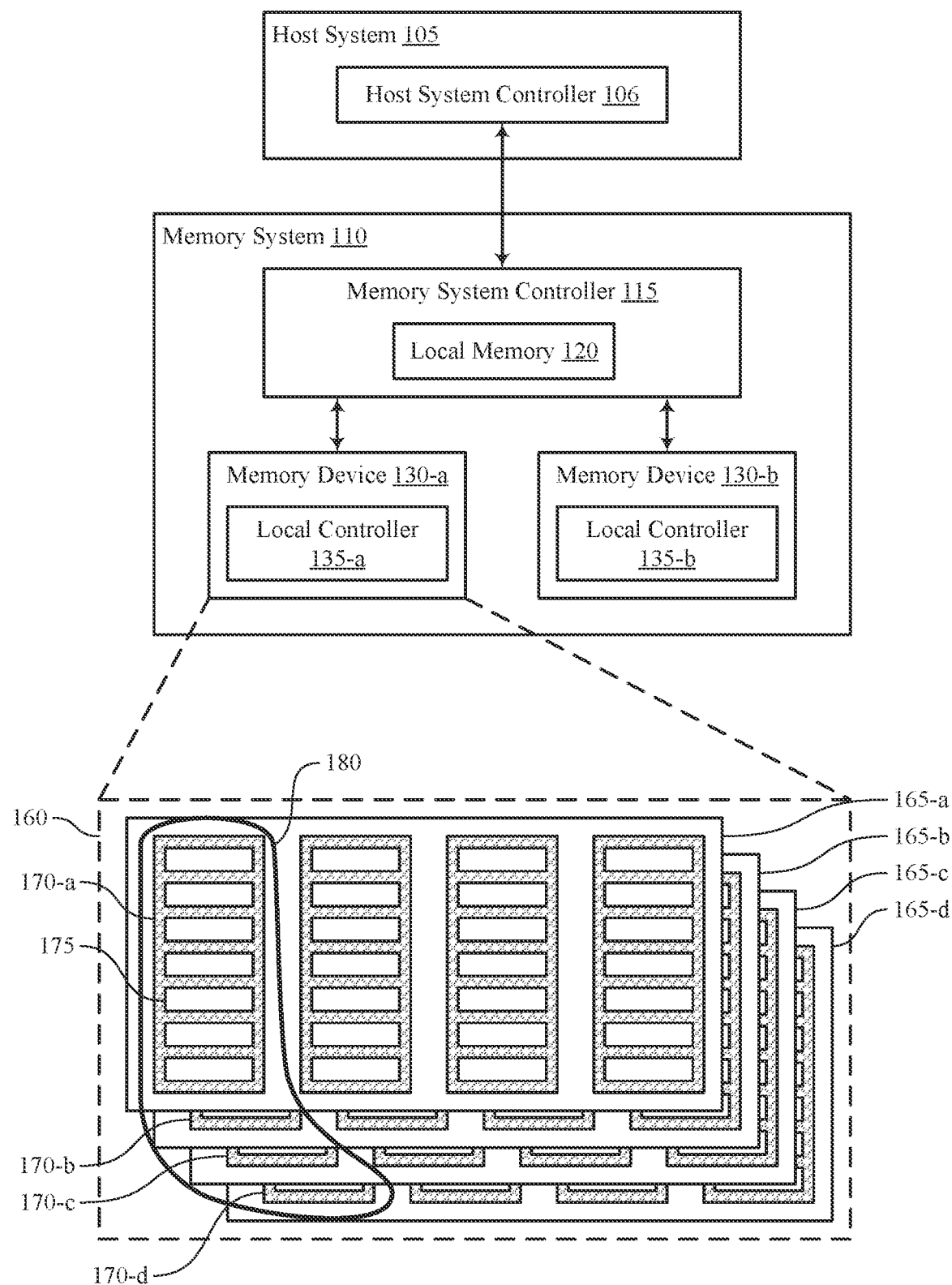
FIG. 1 illustrates an example of a system that supports coding to decrease error rate discrepancy between pages in accordance with examples as disclosed herein.

Some memory devices may include memory cells that are capable of storing a single bit of information, such as single-level cells (SLCs). Each logic state of an SLC may be associated with one of two voltage threshold regions. For example, a first voltage threshold region associated with a lower voltage range may correspond to an SLC storing a logic value '0,' and a second voltage threshold region associated with a higher voltage range may correspond to an SLC storing a logic value '1.' Additionally, memory cells that are capable of storing more than one bit of information, such as multi-level cells (MLCs), tri-level cells (TLCs), or quad-level cells (QLCs), may be associated with multiple voltage threshold regions (e.g., four, eight, sixteen, more than sixteen). In cases where the memory cell stores more than one bit of data, each logic state of the memory cell may correspond to data associated with more than one page of data in some examples. For example, MLCs may store data associated with two pages, TLCs may store data associated with three pages, and QLCs may store data associated with four pages, etc.

In some cases, a memory device may implement a coding scheme to map a logic state of a memory cell to one of the voltage threshold regions. For example, a memory device may rely on a unit-distance code (e.g., a Gray code) to map each logic state of a memory cell to one of a set of voltage threshold regions. Here, to execute a write operation, the memory device may map the one or more bits to be stored in the memory cell to a voltage threshold region associated with the one or more bits according to the unit-distance code, and may program the memory cell to be associated with the corresponding voltage threshold region. To execute a read operation, the memory device may use the unit-distance code to identify a quantity (e.g., a subset) of read voltages associated with one of the pages of data stored by the memory cell, where each read voltage may correspond to a voltage level between adjacent voltage threshold regions of the memory cell. Then, the memory device may apply the quantity (e.g., the subset) of read voltages to detect the data stored by the one page at the memory cell. In some cases, read voltages may drift (e.g., decrease in voltage) over time, which may result in an error rate associated with read operations also increasing over time. Additionally, read voltage shifts may not be uniform for different voltage threshold regions. For example, larger read voltages may be associated with larger voltage drifts compared to smaller read voltages that may be associated with smaller voltage drifts. Some unit-distance codes may indicate a mapping between logic states of a memory cell and voltage threshold regions where the quantity (e.g., the subset) of read voltages associated with a first page of data may be associated with greater voltage drifts than the quantity (e.g., the subset) of read voltages associated with a second page of data. Here, an error rate associated with reading data (e.g., a read bit error rate (RBER) associated with the first page may be greater as compared to an error rate associated with reading data associated with the second page (e.g., due to the read voltages associated with the first page drifting more than the read voltages associated with the second page).

The techniques as described herein provide for operating a memory device using a unit-distance code that is associated with a decreased error rate discrepancy between pages of data stored by memory cells at the memory device. To identify the unit-distance code that is associated with the decreased error rate discrepancy between pages, the voltage drifts associated with at least some, if not each, of the read voltages of a memory cell may be identified. Based on identifying the voltage drifts, each of the read voltages may be mapped to one of the pages of the memory cell according to a first unit-distance code. Then a read voltage drift, such as an average read voltage drift associated with each page, may be determined (e.g., based on the identified voltage drift of each read voltage associated with the page). Additionally, a range of the average read voltage drifts associated with each page may be identified for the first unit-distance code. Similarly, a range of average read voltage drifts associated with each page may be identified for one or more other unit-distance codes. The memory device may be configured to implement a unit-distance code where a range of the average read voltage drifts associated with each page according to that unit-distance code is smaller than a range of the average read voltage drifts associated with each page when one or more other unit-distance codes are used. By decreasing the range of average read voltage drifts associated with each page, an error rate discrepancy between pages that results from large differences between average read voltage drifts associated with each page may be decreased.

Figure 2:
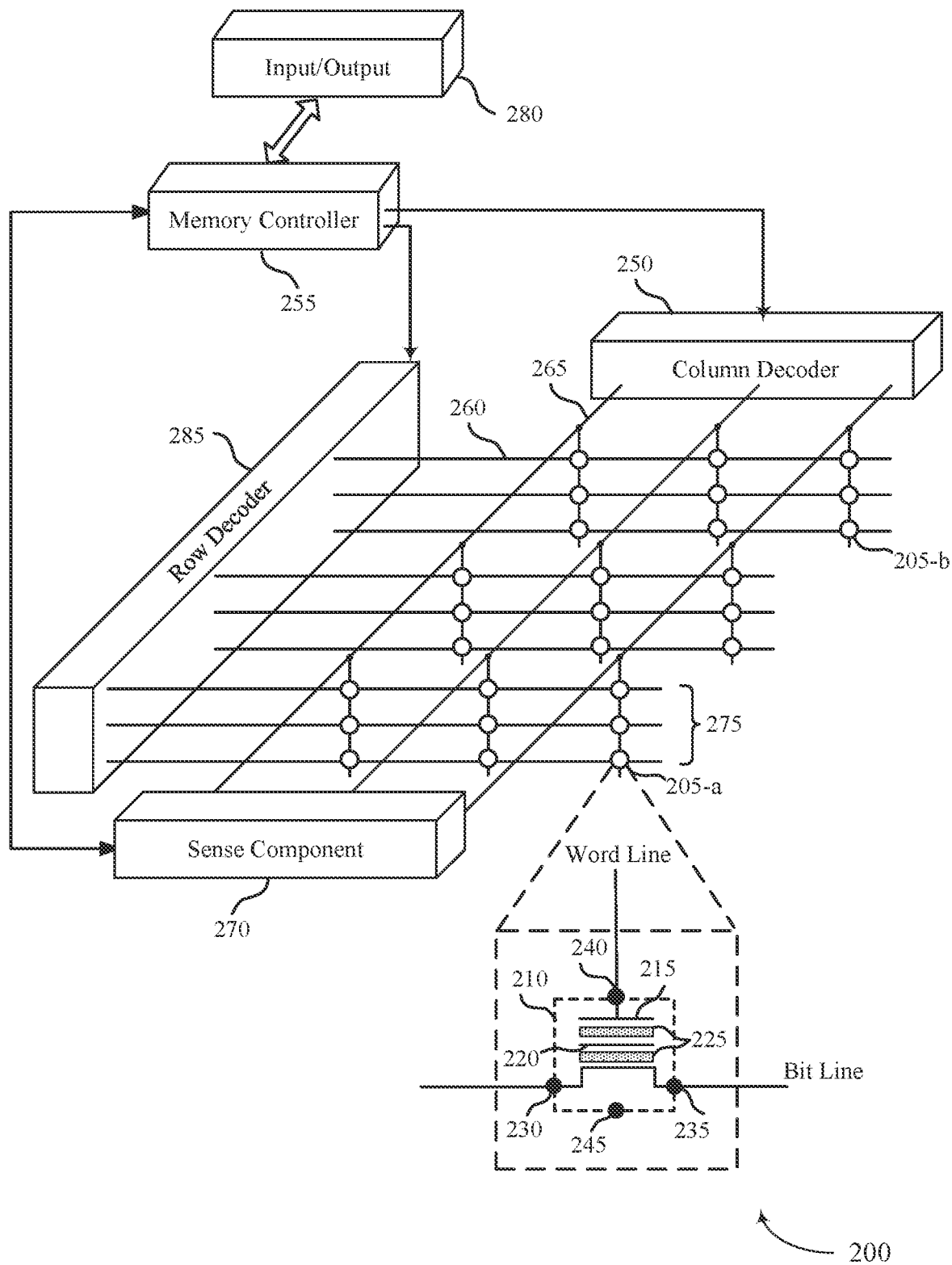
FIG. 2 illustrates an example of a memory device that supports coding to decrease error rate discrepancy between pages in accordance with examples as disclosed herein.

Features of the disclosure are initially described in the context of a system and memory device with reference to FIGS. 1 and 2. Features of the disclosure are described in the context of a voltage threshold distribution, a process flow, and voltage drift data with reference to FIGS. 3 through 5B. These and other features of the disclosure are further illustrated by and described in the context of apparatus diagrams and flowcharts that relate to coding to decrease error rate discrepancy between pages with reference to FIGS. 6 through 9.

FIG. 1 illustrates an example of a system 100 that supports coding to decrease error rate discrepancy between pages in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as SLCs. Additionally, or alternatively, a NAND memory device 130 may include memory cells configured to each store multiple bits of information, which may be referred to as MLCs if configured to each store two bits of information, as TLCs if configured to each store three bits of information, as quad-level cells QLCs if configured to each store four bits of information, as five-level cells (5LCs) if configured to store more than four bits of information, or more generically as multiple-level memory cells. In cases where the memory cell stores more than one bit of data, each logic state of the memory cell may correspond to data associated with more than one page of data. For example, MLCs may store data associated with two pages, TLCs may store data associated with three pages, and QLCs may store data associated with four pages. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, a memory device 130 (or the memory system 110 including the memory device 130) may implement a coding scheme to map a logic state of a memory cell to one of the voltage threshold regions. For example, a memory device 130 may rely on a unit-distance code (e.g., a Gray code) to map each logic state of a memory cell to one of a set of voltage threshold regions. Here, to execute a write operation, the memory device 130 may map the one or more bits to be stored in the memory cell to a voltage threshold region associated with the one or more bits according to the unit-distance code, and may program the memory cell to be associated with the corresponding voltage threshold region. To execute a read operation, the memory device 130 may use the unit-distance code to identify a quantity (e.g., a subset) of read voltages associated with one of the pages of data stored by the memory cell, where each read voltage may correspond to a voltage level between adjacent voltage threshold regions of the memory cell. Then, the memory device 130 may apply the quantity (e.g., the subset) of read voltages to detect the data stored by the one page at the memory cell. In some cases, read voltages may drift (e.g., decrease in voltage) over time, which may result in an error rate (e.g., an RBER) associated with read operations also increasing over time. Additionally, read voltage shifts may not be uniform for different voltage threshold regions. For example, larger read voltages may be associated with larger voltage drifts compared to smaller read voltages that may be associated with smaller voltage drifts. Some unit-distance codes may indicate a mapping between logic states of a memory cell and voltage threshold regions where the quantity (e.g., the subset) of read voltages associated with a first page of data are associated with greater voltage drifts than the quantity (e.g., the subset) of read voltages associated with a second page of data. Here, an error rate associated with reading data associated with the first page may be greater as compared to an error rate associated with reading data associated with the second page (e.g., due to the read voltages associated with the first page drifting more than the read voltages associated with the second page).

In the example of the system 100, one or more of the memory devices 130 (or the memory system 110 including the one or more memory devices 130) may use a unit-distance code that is associated with a decreased error rate discrepancy between pages of data stored by memory cells at the memory device 130. To identify a unit-distance code that is associated with a decreased error rate discrepancy between pages, the voltage drifts associated with each of the read voltages of a memory cell may be identified. Based on identifying the voltage drifts, each of the read voltages may be mapped to one of the pages of the memory cell according to a first unit-distance code. Then an average read voltage drift associated with each page may be determined (e.g., based on the identified voltage drift of each read voltage associated with the page). Additionally, a range of the average read voltage drifts associated with each page may be identified for the first unit-distance code. Similarly, a range of average read voltage drifts associated with each page may be identified for one or more other unit-distance codes. The memory device 130 may be configured to implement a unit-distance code where a range of the average read voltage drifts associated with each page according to that unit-distance code is smaller than a range of the average read voltage drifts associated with each page when one or more other unit-distance codes are used. By decreasing the range of average read voltage drifts associated with each page, an error rate discrepancy between pages that results from large differences between average read voltage drifts associated with each page may be decreased.

In some cases, the unit-distance code may be identified prior to the memory system 110 being integrated with the host system 105. For example, prior to being deployed, the unit-distance code for the one or more memory devices 130 may be identified. Additionally, the one or more memory devices 130 (or, in some cases the memory system 110 including the one or more memory devices 130) may be configured to implement the identified unit-distance code prior to being deployed. After being configured to implement the identified unit-distance code, the memory system 110 may be deployed by being integrated into the system 100. In some other cases, the one or more memory devices 130 may be configured to implement the identified unit-distance code after a deployment of the memory system 110. For example, the host system 105 may indicate the identified unit-distance code to the memory system 110, and the memory system 110 may configure the one or more memory devices 130 to implement the identified unit-distance code.

The system 100 may include any quantity of non-transitory computer readable media that support coding to decrease error rate discrepancy between pages. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

FIG. 2 illustrates an example of a memory device 200 that supports coding to decrease error rate discrepancy between pages in accordance with examples as disclosed herein. In some cases, the memory device 200 may be an example of a memory device 130 as described with reference to FIG. 1. FIG. 2 is an illustrative representation of various components and features of the memory device 200. As such, it should be appreciated that the components and features of the memory device 200 are shown to illustrate functional interrelationships, and not necessarily actual physical positions within the memory device 200. Further, although some elements included in FIG. 2 are labeled with a numeric indicator, some other corresponding elements are not labeled, even though they are the same or would be understood to be similar, in an effort to increase visibility and clarity of the depicted features.

The memory device 200 may include one or more memory cells, such as memory cell 205-*a* and memory cell 205-*b*. A memory cell 205 may be, for example, a flash or other type of NAND memory cell, such as in the blow-up diagram of memory cell 205-*a*. In some other examples, the memory device 200 may include other types of memory cells 205. For example, the memory device 200 may include ROM, PCM, self-selecting memory, other chalcogenide-based memories, FeRAM, MRAM, NOR (e.g., NOR flash) memory, STT-MRAM, CBRAM, RRAM, OxRAM, EEPROM, or any combination thereof. Additionally, or alternatively, the memory device 200 may include one or more arrays of volatile memory cells. For example, the memory device 200 may include RAM memory cells, such as DRAM memory cells and SDRAM memory cells.

Each memory cell 205 may be programmed to store a logic value representing one or more bits of information. In some cases, a single memory cell 205—such as an SLC memory cell 205—may be programmed to one of two supported states and thus may store one bit of information at a time (e.g., a logic 0 or a logic 1). In other cases, a single memory cell 205—such as an MLC, TLC, QLC, or other type of multiple-level memory cell 205—may be programmed to one of more than two supported states and thus may store more than one bit of information at a time. In some examples, a single MLC memory cell 205 may be programmed to one of four supported states and thus may store two bits of information at a time corresponding to one of four logic values (e.g., a logic 00, a logic 01, a logic 10, or a logic 11). In some examples, a single TLC memory cell 205 may be programmed to one of eight supported states and thus may store three bits of information at a time corresponding to one of eight logic values (e.g., 000, 001, 010, 011, 100, 101, 110, or 111). In some examples, a single QLC memory cell 205 may be programmed to one of sixteen supported states and thus may store four bits of information at a time corresponding to one of sixteen logic values (e.g., 0000, 0001, . . . 1111).

In some cases, a multiple-level memory cell 205 (e.g., an MLC memory cell, a TLC memory cell, a QLC memory cell) may be physically different than an SLC cell. For example, a multiple-level memory cell 205 may use a different cell geometry or may be fabricated using different materials. In some cases, a multiple-level memory cell 205 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

Different types of memory cells 205 may store information in different ways. In a DRAM memory array, for example, each memory cell 205 may include a capacitor that includes a dielectric material (e.g., an insulator) to store a charge representative of a programmable state and thus the stored information. In an FeRAM memory array, as another example, each memory cell 205 may include a capacitor that includes a ferroelectric material to store a charge or a polarization representative of a programmable state and thus the stored information.

In some NAND memory arrays (e.g., flash arrays), each memory cell 205 may include a transistor that has a charge trapping structure (e.g., a floating gate, a replacement gate, or a dielectric material) for storing an amount of charge representative of the logic value. For example, the blow-up in FIG. 2 illustrates a NAND memory cell 205-*a* that includes a transistor 210 (e.g., a metal-oxide-semiconductor (MOS) transistor) that may be used to store a logic value. The transistor 210 has a control gate 215 and may also include a charge trapping structure 220 (e.g., a floating gate or a replacement gate), where the charge trapping structure 220 is sandwiched between two portions of dielectric material 225. Transistor 210 includes a first node 230 (e.g., a source or drain) and a second node 235 (e.g., a drain or source). A logic value may be stored in transistor 210 by placing (e.g., writing, storing) a quantity of electrons (e.g., an amount of charge) on charge trapping structure 220. The amount of charge to be stored on the charge trapping structure 220 may depend on the logic value to be stored. The charge stored on charge trapping structure 220 may affect the threshold voltage of transistor 210, thereby affecting the amount of current that flows through transistor 210 when transistor 210 is activated (e.g., when a voltage is applied to the control gate 215). In some examples, the charge trapping structure 220 may be an example of a floating gate that may be part of a 3D NAND structure. For example, a 3D NAND may have multiple floating gates arranged around a single channel (e.g., horizontal or vertical channel). Other structures may also be used for a 3D NAND, including the use of replacement gate technology in the place of floating gate.

A logic value stored in transistor 210 may be sensed (e.g., as part of a read operation) by applying a voltage to the control gate 215 (e.g., to control node 240, via the word line 260) to activate transistor 210 and measuring (e.g., detecting, sensing) the resulting amount of current that flows through the first node 230 or the second node 235 (e.g., via a digit line 265). For example, a sense component 270 may determine whether an SLC memory cell 205 stores a logic 0 or a logic 1 in a binary manner (e.g., based on a presence or absence of a current through the memory cell 205 when a read voltage is applied to the control gate 215, or based on whether the current is above or below a threshold current). For a multiple-level memory cell 205, a sense component 270 may determine a logic value stored in the memory cell 205 based on various intermediate threshold levels of current when a read voltage is applied to the control gate 215.

In one example of a multiple-level architecture, a sense component 270 may determine the logic value of a TLC memory cell 205 based on eight different levels of current, or ranges of current, that define the eight potential logic values that could be stored by the TLC memory cell 205. That is, the sense component 270 may determine the logic state of a TLC memory cell 205 based on whether current flows based on applying different read voltages to the memory cell 205. For example, the sense component 270 may determine the logic state of a TLC based on applying seven different read voltages to the memory cell 205 and determining a presence or absence of a current from the memory cell associated with each read voltage.

In some cases, the sense component 270 may determine the logic state of a portion of the bits stored by the 205. For example, the memory cell 205 may be storing data associated with multiple pages (e.g., three pages if the memory cell 205 is a TLC memory cell 205, four pages if the memory cell 205 is a QLC memory cell) and the sense component 270 may determine the logic state of one of the multiple bits (e.g., associated with one page) stored by the memory cell 205. Here, the sense component 270 may apply a quantity (e.g., a subset) of the read voltages to the memory cell 205. For example, the sense component 270 may determine the logic state of one of the pages stored by the memory cell 205. That is, in the example that the memory cell 205 is a QLC, the sense component 270 may determine logic states of a first page while not determining the logic state of the second, third, and fourth pages. Here, the sense component 270 may apply the identified quantity (e.g., subset) of read voltages to the memory cell 205.

An SLC memory cell 205 may be written by applying one of two voltages (e.g., a voltage above a threshold or a voltage below a threshold) to memory cell 205 to store, or not store, an electric charge on the charge trapping structure 220 and thereby cause the memory cell 205 store one of two possible logic values. For example, when a first voltage is applied to the control node 240 (e.g., via the word line 260) relative to a bulk node 245 for the transistor 210 (e.g., when the control node 240 is at a higher voltage than the bulk), electrons may tunnel into the charge trapping structure 220. In some cases, the bulk node 245 may alternatively be referred to as a body node. Injection of electrons into the charge trapping structure 220 may be referred to as programing the memory cell 205 and may occur as part of a program operation. A programmed memory cell may, in some cases, be considered as storing a logic 0. When a second voltage is applied to the control node 240 (e.g., via the word line 260) relative to the bulk node 245 for the transistor 210 (e.g., when the control node 240 is at a lower voltage than the bulk node 245), electrons may leave the charge trapping structure 220. Removal of electrons from the charge trapping structure 220 may be referred to as erasing the memory cell 205 and may occur as part of an erase operation. An erased memory cell may, in some cases, be considered as storing a logic 1. In some cases, memory cells 205 may be programmed at a page 175 level of granularity due to memory cells 205 of a page 175 sharing a common word line 260, and memory cells 205 may be erased at a block 170 level of granularity due to memory cells 205 of a block sharing commonly biased bulk nodes 245.

In contrast to writing an SLC memory cell 205, writing a multiple-level (e.g., MLC, TLC, or QLC) memory cell 205 may involve applying different voltages to the memory cell 205 (e.g., to the control node 240 or bulk node 245 thereof) at a finer level of granularity to more finely control the amount of charge stored on the charge trapping structure 220, thereby enabling a larger set of logic values to be represented. Thus, multiple-level memory cells 205 may provide greater density of storage relative to SLC memory cells 205 but may, in some cases, involve narrower read or write margins or greater complexities for supporting circuitry.

A charge-trapping NAND memory cell 205 may operate similarly to a floating-gate NAND memory cell 205 but, instead of or in addition to storing a charge on a charge trapping structure 220, a charge-trapping NAND memory cell 205 may store a charge representing a logic state in a dielectric material below the control gate 215. Thus, a charge-trapping NAND memory cell 205 may or may not include a charge trapping structure 220.

In some examples, each row of memory cells 205 may be connected to a corresponding word line 260, and each column of memory cells 205 may be connected to a corresponding digit line 265. Thus, one memory cell 205 may be located at the intersection of a word line 260 and a digit line 265. This intersection may be referred to as an address of a memory cell 205. Digit lines 265 may alternatively be referred to as bit lines. In some cases, word lines 260 and digit lines 265 may be substantially perpendicular to one another and may create an array of memory cells 205. In some cases, word lines 260 and digit lines 265 may be generically referred to as access lines or select lines.

In some cases, memory device 200 may include a three-dimensional (3D) memory array, where multiple two-dimensional (2D) memory arrays may be formed on top of one another. This may increase the quantity of memory cells 205 that may be placed or fabricated on a single die or substrate as compared with 2D arrays, which, in turn, may reduce production costs, or increase the performance of the memory array, or both. In the example of FIG. 2, memory device 200 includes multiple levels (e.g., decks) of memory cell 205. The levels may, in some examples, be separated by an electrically insulating material. Each level may be aligned or positioned so that memory cells 205 may be aligned (e.g., exactly aligned, overlapping, or approximately aligned) with one another across each level, forming a memory cell stack 275.

Accessing memory cells 205 may be controlled through row decoder 285 and column decoder 250. For example, row decoder 285 may receive a row address from memory controller 255 and activate an appropriate word line 260 based on the received row address. Similarly, column decoder 250 may receive a column address from memory controller 255 and activate an appropriate digit line 265. Thus, by activating one word line 260 and one digit line 265, one memory cell 205 may be accessed.

Upon accessing, a memory cell 205 may be read, or sensed, by sense component 270. For example, sense component 270 may be configured to determine the stored logic value of memory cell 205 based on a signal generated by accessing memory cell 205. The signal may include a current, a voltage, or both a current and a voltage on the digit line 265 for the memory cell 205 and may depend on the logic value stored by the memory cell 205. The sense component 270 may include various transistors or amplifiers configured to detect and amplify a signal (e.g., a current or voltage) on a digit line 265. The logic value of memory cell 205 as detected by the sense component 270 may be output via input/output component 280. In some cases, sense component 270 may be a part of column decoder 250 or row decoder 285, or sense component 270 may otherwise be connected to or in electronic communication with column decoder 250 or row decoder 285.

A memory cell 205 may be programmed or written by activating the relevant word line 260 and digit line 265 to enable a logic value (e.g., representing one or more bits of information) to be stored in the memory cell 205. A column decoder 250 or a row decoder 285 may accept data, for example from input/output component 280, to be written to the memory cells 205. As previously discussed, in the case of NAND memory, such as flash memory used in some NAND and 3D NAND memory devices, a memory cell 205 may be written by storing electrons in a charge trapping structure or an insulating layer.

A memory controller 255 may control the operation (e.g., read, write, re-write, refresh) of memory cells 205 through the various components, for example, row decoder 285, column decoder 250, and sense component 270. In some cases, one or more of row decoder 285, column decoder 250, and sense component 270 may be co-located with memory controller 255. A memory controller 255 may generate row and column address signals in order to activate the desired word line 260 and digit line 265. In some examples, a memory controller 255 may generate and control various voltages or currents used during the operation of memory device 200.

In some cases, the memory device 200 may implement a coding scheme to map a logic state of a memory cell 205 to one of the voltage threshold regions. For example, the memory device 200 may rely on a unit-distance code (e.g., a Gray code) to map each logic state of a memory cell 205 to one of a set of voltage threshold regions. Here, to execute a write operation, the memory device 200 may map the one or more bits to be stored in the memory cell 205 to a voltage threshold region associated with the one or more bits according to the unit-distance code, and may program the memory cell 205 to be associated with the corresponding voltage threshold region. To execute a read operation, the memory device 200 may use the unit-distance code to identify a quantity (e.g., a subset) of read voltages associated with one of the pages of data stored by the memory cell 205, where each read voltage corresponds to a voltage level between adjacent voltage threshold regions of the memory cell 205. Then, the memory device 200 may apply the quantity (e.g., the subset) of read voltages to detect the data stored by the one page at the memory cell 205. In some cases, read voltages may drift (e.g., decrease in voltage) over time, which may result in an error rate associated with read operations also increasing over time. Additionally, read voltage shifts may not be uniform for different voltage threshold regions. For example, larger read voltages may be associated with larger voltage drifts compared to smaller read voltages that may be associated with smaller voltage drifts. Some unit-distance codes may indicate a mapping between logic states of a memory cell 205 and voltage threshold regions where the quantity (e.g., the subset) of read voltages associated with a first page of data are associated with greater voltage drifts than the quantity (e.g., the subset) of read voltages associated with a second page of data. Here, an error rate associated with reading data associated with the first page may be greater as compared to an error rate associated with reading data associated with the second page (e.g., due to the read voltages associated with the first page drifting more than the read voltages associated with the second page).

In the example of the memory device 200, the memory device 200 may use a unit-distance code that is associated with a decreased error rate discrepancy between pages of data stored by memory cells 205 at the memory devices 200. To identify a unit-distance code that is associated with a decreased error rate discrepancy between pages, the voltage drifts associated with each of the read voltages of a memory cell 205 may be identified. Based on identifying the voltage drifts, each of the read voltages may be mapped to one of the pages of the memory cell 205 according to a first unit-distance code. Then an average read voltage drift associated with each page may be determined (e.g., based on the identified voltage drift of each read voltage associated with the page). Additionally, a range of the average read voltage drifts associated with each page may be identified for the first unit-distance code. Similarly, a range of average read voltage drifts associated with each page may be identified for one or more other unit-distance codes. The memory device 200 may be configured to implement a unit-distance code where a range of the average read voltage drifts associated with each page according to that unit-distance code is smaller than a range of the average read voltage drifts associated with each page when one or more other unit-distance codes are used. By decreasing the range of average read voltage drifts associated with each page, an error rate discrepancy between pages that results from large differences between average read voltage drifts associated with each page may be decreased.

In some cases, the unit-distance code may be identified prior to the memory device 200 being integrated with a host system (and in some cases prior to the memory device 200 being integrated with a memory system). For example, prior to being deployed, the unit-distance code for the memory device 200 may be identified and the memory device 200 may be configured to implement the identified unit-distance code prior to being deployed. After being configured to implement the identified unit-distance code, the memory device 200 may be deployed by being integrated into a system. Thus, the memory device 200 may operate using a unit-distance code associated with a range of the average read voltage drifts associated with each page that is smaller than a range of the average read voltage drifts associated with each page when other memory devices 200 implement one or more other unit-distance codes.

Figure 3:
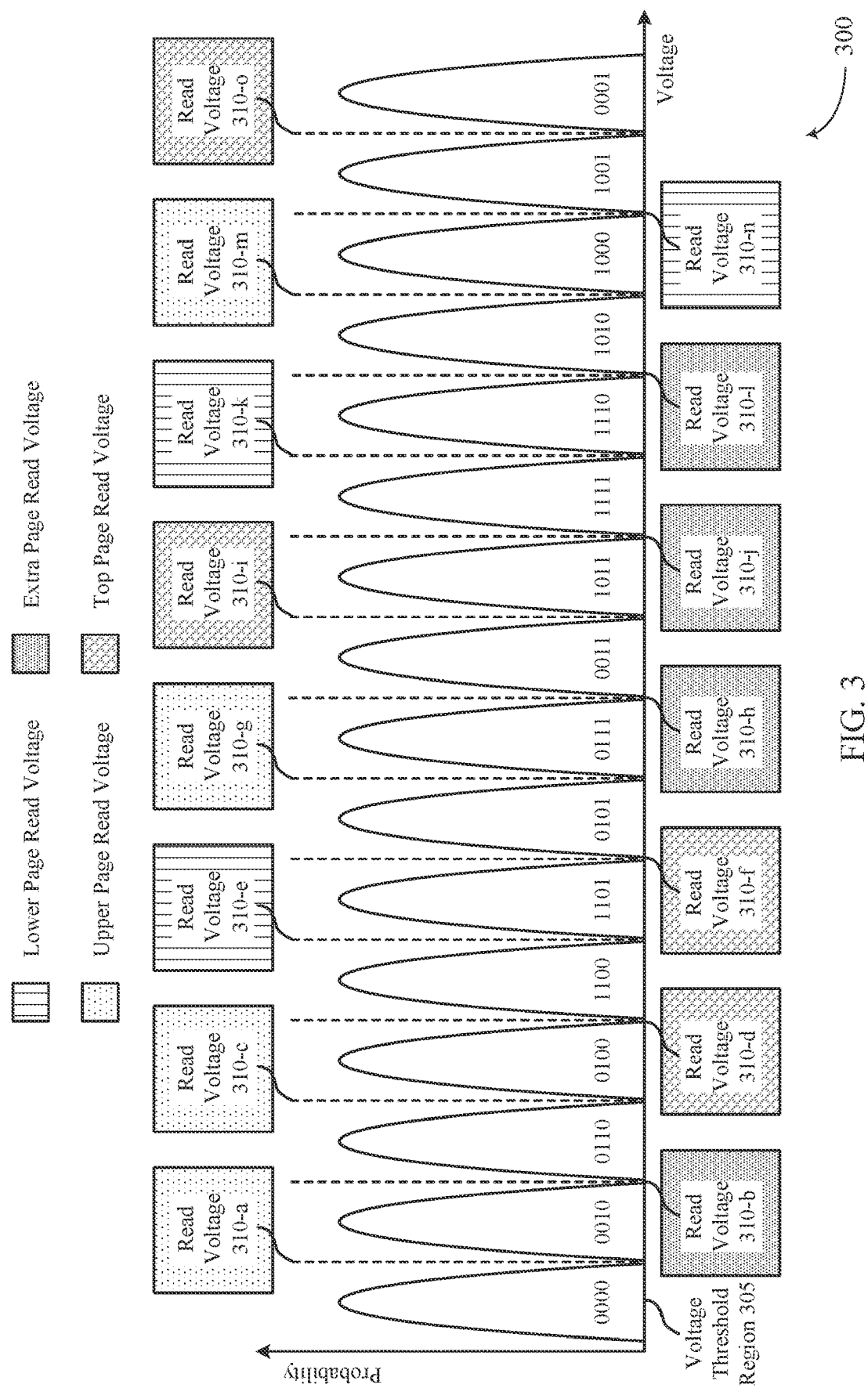
FIG. 3 illustrates an example of a unit-distance code that supports coding to decrease error rate discrepancy between pages in accordance with examples as disclosed herein.

FIG. 3 illustrates an example of a unit-distance code 300 that supports coding to decrease error rate discrepancy between pages in accordance with examples as disclosed herein. The unit-distance code 300 may illustrate an example unit-distance code 300 that maps the logic states of a QLC to of the sixteen voltage threshold regions 305 of the QLC. Although the unit-distance code 300 illustrates an example unit-distance code 300 of a QLC, similar unit-distance codes 300 may illustrate different mappings for a QLC or for memory cells that store other quantities of bits. For example, an MLC or TLC may be associated with a similar unit-distance code 300 with different quantities of voltage threshold regions 305 (e.g., based on a quantity of bits stored by the memory cell).

According to the examples disclosed herein, the unit-distance code 300 may indicate a mapping between the different logic states of the QLCs. The unit-distance code 300 may be represented (e.g., via a binary representation) where only one bit changes for each increment or decrement in value. For example, a single bit change in the logic states occurs when transitioning from one voltage threshold region 305 to an adjacent voltage threshold region. The voltage threshold regions 305 may be mapped to one of 2× levels, where X represents the number of bits used to store information in the memory cell. Accordingly, a four bit unit-distance code 300 may be used to map the sixteen different logic states of a QLC to one of the sixteen different voltage threshold regions 305.

In some examples, the voltage threshold regions of the memory cell may be representative of voltage range such as 0V-5V. The voltage threshold regions 305 may be associated with different logic states of a QLC in accordance with the unit-distance code 300. For example, the unit-distance code 300 may map the voltage threshold region 305 corresponding to a lowest voltage range of the memory cell to the logic value '0000.' In another example, the unit-distance code 300 may map the voltage threshold region 305 corresponding to a highest voltage range of the memory cell may to the logic value '0001.' In some cases, each logic state may correspond to data associated with more than one page of data. For example, the voltage threshold region 305 associated with the logic value '1010' may include data associated with four pages (e.g., a lower page, an upper page, an extra page, and a top page). That is, the first bit '1' may be associated with the top page, the second bit '0' may be associated with the extra page, the third bit '1' may be associated with the upper page, and the fourth bit '0' may be associated with the lower page.

The read voltages 310 may correspond to voltage levels between adjacent voltage threshold regions and may be examples of read voltages 310 as described with reference to FIGS. 1 and 2. As described herein, a memory device may apply one or more read voltages 310 to one or more memory cells to determine the logic values stored by the one or more memory cells. For example, the memory device may apply each of the read voltages 310 to one or more memory cells to read each page of data stored by the one or more memory cells. In another example, the memory device may apply a quantity (e.g., a subset) of the read voltages 310 to the one or more memory cells to read a quantity (e.g., a subset) of the pages of data stored by the one or more memory cells. For example: the memory device may apply one or more of the read voltages 310-$e$, 310-$k$, and 310-$n$ to determine a value stored by a lower page of the memory cell; the memory cell may apply one or more the read voltages 310-$a$, 310-$c$, 310-$g$, and 310-$m$ to determine a value stored by the upper page of the memory cell; the memory cell may apply one or more of the read voltages 310-$b$, 310-$h$, 310-$j$, and 310-$l$ to determine a value stored by the extra page of the memory cell; and the memory cell may apply one or more of the read voltages 310-$d$, 310-$f$, 310-I, and 310-$o$ to determine a value stored by the top page of the memory cell.

Over time, the read voltages 310 may drift. For example, the read voltages 310 may decrease after a duration. That is, the voltage threshold regions 305 of the memory cell may shift (e.g., by decreasing in voltage) over time. As a result, the read voltages 310, which may correspond to voltage levels between adjacent voltage threshold regions 305, may also shift over time. In some cases, the voltage threshold regions 305 and corresponding read voltages 310 may not exhibit uniform voltage shifts or drifts over the similar durations of time. For example, the voltage threshold regions 305 associated with larger voltages (e.g., the voltage threshold regions 305 corresponding to the logic states '0001,' '1001, and '1000') may shift more than the voltage threshold regions 305 associated with smaller voltages (e.g., the voltage threshold regions 305 corresponding to the logic states '0000,' '0010,' and '0110'). Additionally, the read voltages 310 associated with larger voltages (e.g., the read voltages 310-$o$, 310-$n$, and 310-$m$) may also shift or drift more than the read voltages 310 associated with smaller voltages (e.g., the read voltages 310-, 310-$b$, and 310-$c$). In some cases, the voltage drifts of the read voltages 310 may cause an increase in error rates (e.g., during read operations) over time.

Some unit-distance codes 300 may indicate a mapping between voltage threshold regions and logic states that may result in some pages being associated with larger read voltage shifts as compared to other pages. For example, a unit-distance code 300 may indicate a mapping where, to read data associated with a first page type, the memory device may apply a subset of the read voltages 310 that exhibit a larger average voltage drift than another subset of the read voltages 310 applied by the memory device to read data associated with a second page type. Here, read operations to detect data stored by the first page type may be associated with more errors over time then read operations to detect data stored by the second page type.

In the example of the unit-distance code 300, the difference between or range of average voltage drifts of subsets of read voltages 310 associated with the different page types (e.g., the lower page, upper page, extra page, and top page) may be smaller than one or more other unit-distance codes. That is, a range of the average voltage drifts of the read voltages 310 associated with the lower page (e.g., the read voltages 310-$e$, 310-$k$, and 310-$n$), the average voltage drifts of the read voltages 310 associated with the upper page (e.g., the read voltages 310-$a$, 310-$c$, 310-$g$, and 310-$m$), the average voltage drifts of the read voltages 310 associated with the extra page (e.g., the read voltages 310-$b$, 310-$h$, 310-$j$, and 310-$l$), the average voltage drifts of the read voltages 310 associated with the top page (e.g., the read voltages 310-$d$, 310-$f$, 310-$i$, and 310-$o$) may be smaller as compared to a range of average voltage drifts of subsets of read voltages 310 associated with the different page types of a memory cell at a memory device that implements another unit-distance code. In some instances, this may decrease a discrepancy between page types of errors resulting from the read voltage drifts.

Figure 4:
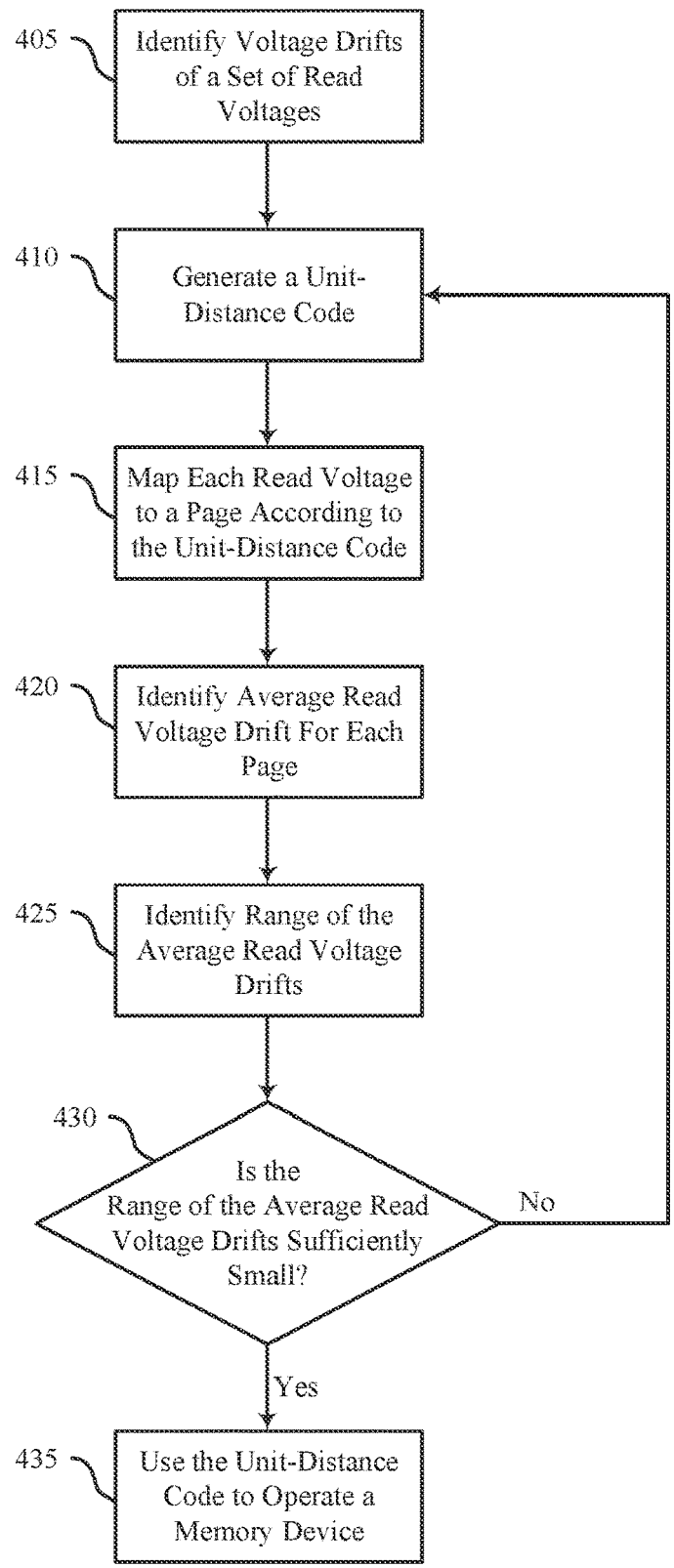
FIG. 4 illustrates an example of a process flow that supports coding to decrease error rate discrepancy between pages in accordance with examples as disclosed herein.

FIG. 4 illustrates an example of a process flow 400 that supports coding to decrease error rate discrepancy between pages in accordance with examples as disclosed herein. For example, aspects of the process flow 400 may be implemented to select a unit-distance code for operating a memory device as described herein. In some cases, one or more aspects of the process flow 400 may be implemented prior to operating a memory device (e.g., to store data within a memory system). For example, the operations performed at 405, 410, 415, 420, 425, and 430 may be performed after a memory device that includes memory cells capable of storing more than one bit of information (e.g., MLCs, TLCs, QLCs) is manufactured, but prior to the memory device being integrated with a memory system that is in electronic communication with a host system. Additionally, the operations performed at 435 may occur either before or after the memory device is integrated with the memory system.

At 405, a set of voltage drifts may be identified. That is, a set of initial read voltages of a memory cell may be identified. After a duration, a voltage drift associated with each of the read voltages may be identified. For example, after the duration, a set of second read voltages of the memory cell may be identified and the set of voltage drifts may be identified based on a difference between the set of initial read voltages and the set of second read voltages. In some cases, during the duration the memory device may be baked. That is, a temperature of the memory device may be increased (e.g., by an oven) for the duration. In some instances, baking the memory device may simulate an operational time period of the memory device (e.g., an amount of time that the memory device is operating within a system, such as system 100) that is greater than the duration that the memory device is baked. Table 1, shown below, illustrates an example of various baking temperatures and times that result in similar degradations of a memory device. That is, the baking temperatures and times associated with a same index may each result in similar degradations of the memory device.

TABLE 1

Baking Table

| Index | Seconds at 110° C. | Months at 40° C. | Minutes at 85° C. |
|---|---|---|---|
| 0 | 0 | 0.0 | 0.0 |
| 1 | 1800 | 0.1 | 1.5E2 |
| 2 | 3600 | 0.2 | 3.0E2 |
| 3 | 7200 | 0.5 | 6.0E2 |
| 4 | 15035 | 1.0 | 1.3E3 |
| 5 | 22550 | 1.5 | 1.9E3 |
| 6 | 30070 | 2.0 | 2.5E3 |
| 7 | 45105 | 3.0 | 2.8E3 |

In one example, at 405 (e.g., after identifying the set of initial read voltages of the memory device), the memory device may be baked for a time and duration associated with index 4. For example, the memory device may be baked for approximately 15,035 seconds at 110° C., for approximately 1 month at 40° C., or for approximately 1.3E3 minutes at 85° C.

At 410, a unit-distance code may be generated. That is, for a memory cell that is configured to store multiple bits, there may be multiple valid unit-distance codes. A valid unit-distance code may correspond to a unit-distance code that maps each of the possible logic states stored by a memory cell (e.g., X logic states) to each of the voltage threshold regions of the memory cell (e.g., $2^X$ voltage threshold regions) such that only a single bit change occurs between data represented by adjacent voltage threshold regions of the memory cell.

At 415, the read voltages of the memory cell may be mapped to one of the pages according to the unit-distance code (e.g., generated at 410). That is, as described with reference to FIGS. 1 through 3, each of the pages may be associated with a subset of the read voltages in accordance with a unit-distance code. At 415, the subsets of read voltages, each associated with a page type, may be identified (e.g., by mapping each read voltage to a page type).

At 420, the average read voltage drift for each page associated with the unit-distance code (e.g., generated at 410) may be identified. For example, to identify an average read voltage drift associated with a first page type, a composite voltage drift (e.g., a total read voltage drift) of each of the read voltages within the subset associated with the first page type may be identified. For example, the voltage drifts associated with each read voltage in the subset (e.g., that are identified at 405) may be summed, which may correspond to the composite voltage drift for each page type. Then, the composite voltage drift (e.g., the total read voltage drift) for the first page type may be divided by the quantity of read voltages associated with that page type. In an example where the memory cells are QLCs, the first page type may be associated with three or four read voltages. Here, the composite voltage drift (e.g., the total read voltage drift) may be divided by three or four (e.g., based on whether the subset of read voltages associated with the first page type includes three or four read voltages), which may yield the average read voltage drift associated with the first page type. Similar operations may be performed to determine the average read voltage drift for each of the other page types (e.g., summation operations to determine the composite voltage drifts associated with the page type, and division operations on the composite voltage drifts).

At 425, the range of the average read voltage drifts associated with the unit-distance code generated at 410 may be identified. For example, a difference between the largest average read voltage drift and the smallest average read voltage drift identified at 420 may be determined. This difference may correspond to the range of the average read voltage drifts associated with the unit-distance code. In some cases, smaller ranges of average read voltage drifts may result in smaller error discrepancies between page types resulting from read voltage drifts.

At 430, a determination may be made as to whether the range of the average read voltage drifts associated with the unit-distance code generated at 410 is sufficiently small. In cases that the range of average read voltage drifts associated with the unit-distance code generated at 410 is determined to be sufficiently small, the process may proceed to 435. Additionally, in cases that the range of average read voltage drifts associated with the unit-distance code generated at 410 is not determined to be sufficiently small, the process may proceed to 410 and generate another, different unit-distance code.

In some cases, the determination of whether the range of the average read voltage drifts associated with the unit-distance code generated at 410 is sufficiently small may be based on other ranges of average read voltage drifts (e.g., associated with other unit-distance codes generated at 410). That is, multiple iterations of the operations performed at 410, 415, 420, and 425 may be executed. Here, the range of average read voltage drifts identified at 425 may be determined to be sufficiently small in cases that the range of the average read voltage drifts identified at 425 is smaller than the other range of average read voltage drifts associated with other unit-distance codes identified during other iterations of the operations performed at 410, 415, 420, and 425.

In another case, the determination of whether the range of the average read voltage drifts associated with the unit-distance code generated at 410 is sufficiently small may be based on a threshold range of average read voltage drifts. For example, the range of average read voltage drifts identified at 425 may be determined to be sufficiently small in cases the range of the average read voltage drifts that is identified at 425 is less than a threshold. Additionally, the range of average read voltage drifts identified at 425 may be determined to not be sufficiently small in cases the range of the average read voltage drifts that is identified at 425 is greater than the threshold. In some cases, the threshold may be based on a smallest previously-identified range of average read voltage drifts associated with a previously-generated unit-distance code. Here, in cases that the range of the average read voltage drifts that is identified at 425 is less than the threshold, rather than proceed to 435, the threshold may be updated to be the range of the average read voltage drifts identified at 425 and one or more additional iterations of the operations performed at 410, 415, 420, and 425 may be executed. Here, the process may proceed to 435 after a threshold quantity of iterations of the operations performed at 410, 415, 420, and 425 have been executed.

At 435, a memory device may operate using a unit-distance code generated at 410 that corresponds to a smallest (or one of the smallest) identified range of average read voltage drifts. That is, multiple iterations of the operations performed at 410, 415, 420, and 425 may be executed, where each iteration yields a generated unit-distance code associated with an identified range of average read voltage drifts. After executing each of the iterations, the memory device may be configured to implement the unit-distance code associated with a smallest (or one of the smallest) ranges of average read voltage drifts. In some cases, configuring the memory device to implement a unit-distance code associated with a smaller range of average read voltage drifts than other unit-distance codes may decrease an error rate discrepancy between page types due to read voltage drifts.

Figure 5:
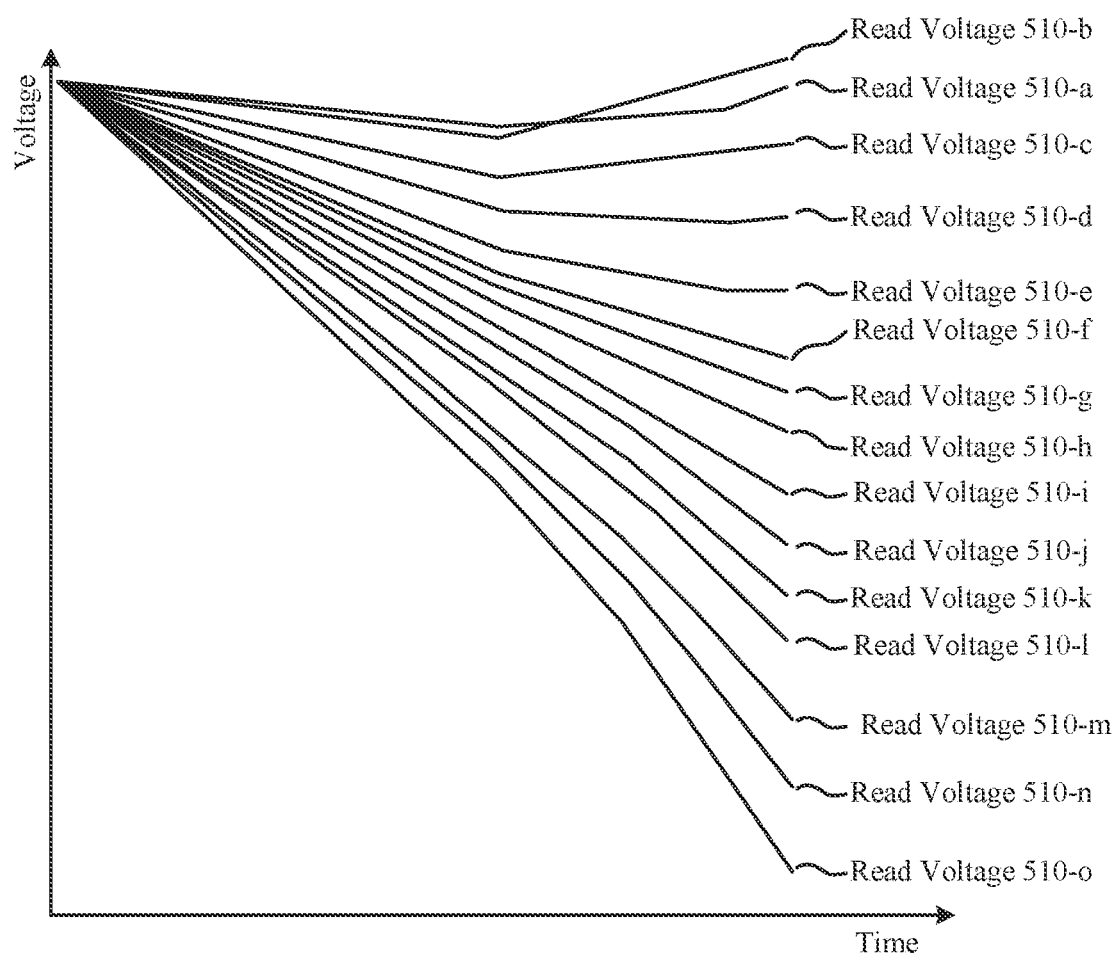
FIG. 5 illustrates an examples of voltage drifts that support coding to decrease error rate discrepancy between pages in accordance with examples as disclosed herein.

FIG. 5 illustrates an example of voltage drifts 500 that supports coding to decrease error rate discrepancy between pages in accordance with examples as disclosed herein. The voltage drifts 500 may be an example of voltage drifts 500 identified as part of the process flow 400 illustrated with reference to FIG. 4. For example, the voltage drifts 500 may illustrate how a set of read voltages 510 change over a duration. In the case of the voltage drifts 500, each of the read voltage 510 have no drift initially (e.g., the corresponding read voltages have not changed) and generally decrease over time.

Table 2, shown below, illustrates example values of the read voltages 510 drift after a duration. For example, the example values illustrated in Table 2 may be read voltage changes after a process performed on the memory device (e.g., baking) that simulates a degradation of the memory device operating at 40° C. for approximately one month.

TABLE 2

Example Read Voltage Drifts

| Read Voltage Drift | Millivolts (mV) |
| --- | --- |
| 510-a | 5 |
| 510-b | 12 |
| 510-c | 35 |
| 510-d | 62 |
| 510-e | 88 |
| 510-f | 110 |
| 510-g | 122 |
| 510-h | 130 |
| 510-i | 157 |
| 510-j | 173 |
| 510-k | 190 |
| 510-l | 205 |
| 510-m | 233 |
| 510-n | 258 |
| 510-o | 285 |

In some cases, after identifying the voltage drifts 500, one or more operations may be performed to identify a unit-distance code associated with a smaller range of average read voltage drift, where each average read voltage drift corresponds to an average of the read voltage drifts of the subset of read voltages 510 associated with a page type. Table 3, shown below, illustrates an example unit-distance code, and the mapping between read voltages 510 and page types.

TABLE 3

Example Unit-Distance Code

| Read Voltage | Logic State | Page Type |
| --- | --- | --- |
|  | 1111 |  |
| 510-a | 1110 | Lower |
| 510-b | 1010 | Extra |
| 510-c | 1000 | Upper |
| 510-d | 1001 | Lower |
| 510-e | 0001 | Top |
| 510-f | 0000 | Lower |
| 510-g | 0010 | Upper |
| 510-h | 0110 | Extra |
| 510-i | 0100 | Upper |
| 510-j | 1100 | Top |
| 510-k | 1101 | Lower |
| 510-l | 0101 | Top |

TABLE 3-continued

Example Unit-Distance Code

| Read Voltage | Logic State | Page Type |
| --- | --- | --- |
| 510-m | 0111 | Upper |
| 510-n | 0011 | Extra |
| 510-o | 1011 | Top |

In the example of Table 3, the lower page is associated with the read voltages 510-a, 510-d, 510-f, and 510-k; the upper page is associated with the read voltages 510-c, 510-g, 510-i, and 510-m; the extra page is associated with the read voltages 510-b, 510-h, and 510-n; and the top page is associated with the read voltages 510-e, 510-j, 510-l, and 510-o. Based on the example voltage drift values illustrated by Table 3, the average read voltage drift associated with the lower page is 92 mV, the average read voltage drift associated with the upper page is approximately 137 mV, the average read voltage drift associated with the extra page is approximately 133 mV, and the average read voltage drift associated with the top page is approximately 188 mV. Thus, in the example of the unit-distance code illustrated in Table 3, the range of the average read voltage drifts of the pages corresponds to the difference between 188 mV (e.g., associated with the top page) and 92 mV (e.g., associated with the lower page), which is 96 mV.

Table 4, shown below, illustrates another example unit-distance code, and the mapping between read voltages 510 and page types. The unit-distance code illustrated by Table 4 corresponds to the unit-distance code illustrated in FIG. 3.

TABLE 4

Example Unit-Distance Code

| Read Voltage | Logic State | Page Type |
| --- | --- | --- |
|  | 0000 |  |
| 510-a | 0010 | Upper |
| 510-b | 0110 | Extra |
| 510-c | 0100 | Upper |
| 510-d | 1100 | Top |
| 510-e | 1101 | Lower |
| 510-f | 0101 | Top |
| 510-g | 0111 | Upper |
| 510-h | 0011 | Extra |
| 510-i | 1011 | Top |
| 510-j | 1111 | Extra |
| 510-k | 1110 | Lower |
| 510-l | 1010 | Extra |
| 510-m | 1000 | Upper |
| 510-n | 1001 | Lower |
| 510-o | 0001 | Top |

In the example of Table 4, the lower page is associated with the read voltages 510-e, 510-k, and 510-n; the upper page is associated with the read voltages 510-a, 510-c, 510-g, and 510-m; the extra page is associated with the read voltages 510-b, 510-h, 510-j, and 510-l; and the top page is associated with the read voltages 510-d, 510-f, 510-i, and 510-o. Based on the example voltage drift values illustrated by Table 3, the average read voltage drift associated with the lower page is 178 mV, the average read voltage drift associated with the upper page is approximately 99 mV, the average read voltage drift associated with the extra page is approximately 127 mV, and the average read voltage drift associated with the top page is approximately 153 mV. Thus, in the example of the unit-distance code illustrated in Table 3, the range of the average read voltage drifts of the pages corresponds to the difference between 178 mV (e.g., associated with the top page) and 99 mV (e.g., associated with the lower page), which is 79 mV.

In these examples, the unit-distance code illustrated by Table 4 may be selected (e.g., via the process illustrated in FIG. 4) to be implemented by a memory device. That is, the range of the average read voltage drift for the unit-distance code illustrated by Table 4 is less than the range of the average read voltage drift for the unit-distance code illustrated by Table 3. In some cases, a memory device configured to use the unit-distance code illustrated by Table 4 may be associated with a lower RBER discrepancies between page types as compared to a memory device configured to use the unit-distance code illustrated by Table 3.

Figure 6:
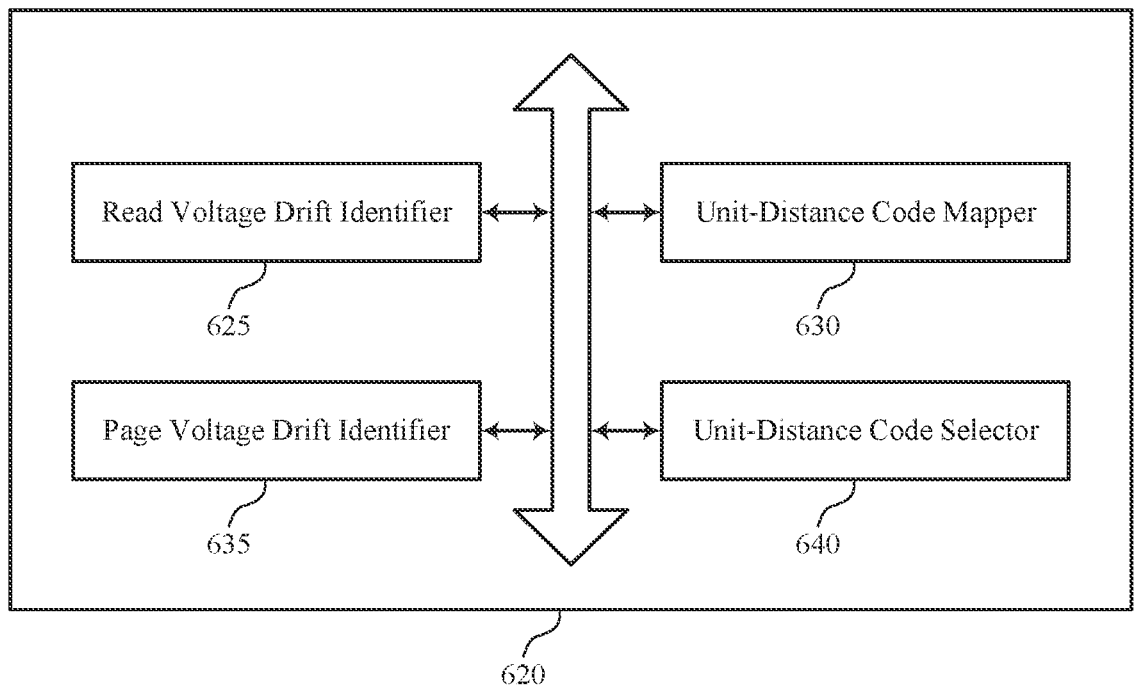
FIG. 6 shows a block diagram of a manufacturing system that supports coding to decrease error rate discrepancy between pages in accordance with examples as disclosed herein.

FIG. 6 shows a block diagram 600 of a manufacturing system 620 that supports coding to decrease error rate discrepancy between pages in accordance with examples as disclosed herein. The manufacturing system 620 may be an example of aspects of a manufacturing system as described with reference to FIGS. 1 through 5. The manufacturing system 620, or various components thereof, may be an example of means for performing various aspects of coding to decrease error rate discrepancy between pages as described herein. For example, the manufacturing system 620 may include a read voltage drift identifier 625, a unit-distance code mapper 630, a page voltage drift identifier 635, a unit-distance code selector 640, or any combination thereof. Each of these components may communicate, directly or indirectly, with one another (e.g., via one or more buses).

The read voltage drift identifier 625 may be configured as or otherwise support a means for identifying, after a duration, voltage drifts of a plurality of read voltages, the plurality of read voltages corresponding to a plurality of voltage levels between adjacent voltage threshold regions of a memory cell at a memory device. The unit-distance code mapper 630 may be configured as or otherwise support a means for mapping the plurality of read voltages to one of a plurality of pages of the memory cell using a unit-distance code, where the plurality of pages are associated with respective subsets of the plurality of read voltages according to the unit-distance code. The page voltage drift identifier 635 may be configured as or otherwise support a means for identifying a plurality of average read voltage drifts each corresponding to one of the plurality of pages based at least in part on the voltage drifts of read voltages within the respective subsets of the plurality of read voltages. The unit-distance code selector 640 may be configured as or otherwise support a means for operating the memory device using the unit-distance code based at least in part on a range of the plurality of average read voltage drifts each corresponding to one of the plurality of pages associated with the unit-distance code being less than one or more other ranges of a plurality of average read voltage drifts that each correspond to one of the plurality of pages associated with one or more other unit-distance codes.

In some examples, the unit-distance code mapper 630 may be configured as or otherwise support a means for mapping the plurality of read voltages to one of the plurality of pages of the memory cell using a second unit-distance code different than the unit-distance code, where the plurality of pages are associated with respective second subsets of the plurality of read voltages according to the second unit-distance code. In some examples, the page voltage drift identifier 635 may be configured as or otherwise support a means for identifying a plurality of second average read voltage drifts each corresponding to one of the plurality of pages based at least in part on the voltage drifts of each read voltage within the respective second subsets of the plurality of read voltages. In some examples, the unit-distance code selector 640 may be configured as or otherwise support a means for selecting to operate the memory device using the unit-distance code based at least in part on a second range of the plurality of second average read voltage drifts being greater than range of the plurality of average read voltage drifts, where operating the memory device is based at least in part on the selecting.

In some examples, the unit-distance code selector 640 may be configured as or otherwise support a means for comparing the second range of the plurality of second average read voltage drifts to the range of the plurality of average read voltages, where mapping the plurality of read voltages to one of the plurality of pages of the memory cell using the unit-distance code is based at least in part on the second range of the second average read voltage drift exceeding the range of the plurality of average read voltages.

In some examples, the page voltage drift identifier 635 may be configured as or otherwise support a means for performing summation operations on the voltage drifts of the read voltages within the respective subsets of the plurality of read voltages to identify composite voltage drifts each corresponding to one of the plurality of pages, where identifying the plurality of average read voltage drifts is based at least in part on performing the summation operations.

In some examples, to support identifying the plurality of average read voltage drifts, the page voltage drift identifier 635 may be configured as or otherwise support a means for dividing each of the composite voltage drifts by a quantity of the read voltages in the respective subsets of the plurality of read voltages.

In some examples, the read voltage drift identifier 625 may be configured as or otherwise support a means for programming a plurality of memory cells at the memory device. In some examples, the read voltage drift identifier 625 may be configured as or otherwise support a means for increasing a temperature of the memory device for the duration, where identifying the voltage drift of the plurality of read voltages is based at least in part on increasing the temperature of the memory device for the duration.

In some examples, the memory cell is QLC and includes sixteen voltage threshold regions. In some examples, mapping the plurality of read voltages to one of the plurality of pages includes mapping fifteen read voltages to one of four pages of the memory cell.

In some examples, the memory cell is a TLC or an MLC and includes eight voltage threshold regions or more than sixteen voltage threshold regions. In some examples, mapping the plurality of read voltages to one of the plurality of pages includes mapping seven read voltages to one of three pages of the memory cell or mapping more than fifteen read voltages to more than four pages of the memory cell.

In some examples, the memory cell includes a floating gate configuration or a replacement gate configuration.

In some examples, the unit-distance code includes a Gray code.

Figure 7:
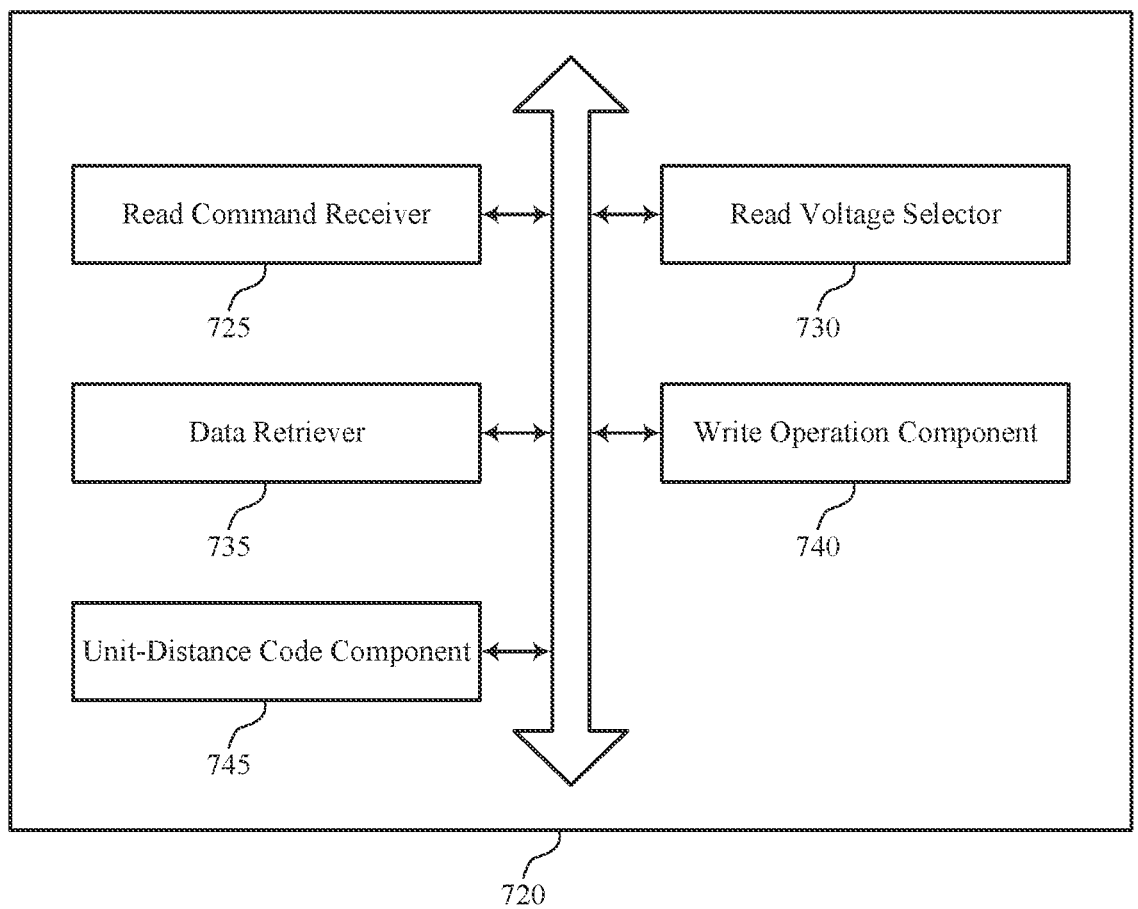
FIG. 7 shows a block diagram of a memory system that supports coding to decrease error rate discrepancy between pages in accordance with examples as disclosed herein.

FIG. 7 shows a block diagram 700 of a memory system 720 that supports coding to decrease error rate discrepancy between pages in accordance with examples as disclosed herein. The memory system 720 may be an example of aspects of a memory system as described with reference to FIGS. 1 through 5. The memory system 720, or various components thereof, may be an example of means for performing various aspects of coding to decrease error rate discrepancy between pages as described herein. For example, the memory system 720 may include a read command receiver 725, a read voltage selector 730, a data retriever 735, a write operation component 740, a unit-distance code component 745, or any combination thereof. Each of these components may communicate, directly or indirectly, with one another (e.g., via one or more buses).

The read command receiver 725 may be configured as or otherwise support a means for receiving a read command to retrieve data from a memory cell including a plurality of pages, the data associated with a first page from the plurality of pages. The read voltage selector 730 may be configured as or otherwise support a means for selecting, from a plurality of read voltages, a subset of read voltages that are associated with the first page according to a first unit-distance code, where the first unit-distance code indicates a mapping between the plurality of pages of the memory cell and respective first subsets of the plurality of read voltages. The data retriever 735 may be configured as or otherwise support a means for retrieving, from the memory cell, the data indicated by the read command based at least in part on applying one or more of the subset of read voltages to the memory cell, where a range of average read voltage drifts that each correspond to one of the plurality of pages and are based at least in part on voltage drifts of the read voltages within respective second subsets of the plurality of read voltages indicated by a second unit-distance code is decreased based at least in part on the mapping between the plurality of pages of the memory cell and the respective first subsets of the plurality of read voltages indicated by the first unit-distance code.

In some examples, the plurality of read voltages are each associated with a voltage drift after a duration. In some examples, a second range of second average read voltage drifts that each correspond to one of the plurality of pages and are based at least in part on the voltage drifts of the read voltages within the respective first subsets of the plurality of read voltages is less than the range of average read voltage drifts that are based at least in part on the voltage drifts of the read voltages within the respective second subsets of the plurality of read voltages.

In some examples, the write operation component 740 may be configured as or otherwise support a means for receiving second data for storage in the memory cell. In some examples, the unit-distance code component 745 may be configured as or otherwise support a means for mapping the second data to a voltage threshold region of the memory cell using the first unit-distance code. In some examples, the write operation component 740 may be configured as or otherwise support a means for writing the data to the plurality of pages in the memory cell based at least in part on mapping the data to the voltage threshold region using the first unit-distance code.

In some examples, for the first unit-distance code and the second unit-distance code, a one-bit change occurs in data stored by only one of the plurality of pages between a representation of data stored by adjacent voltage threshold regions of the memory cell.

In some examples, the memory cell is a QLC and includes four pages. In some examples, selecting the subset of the read voltages includes selecting three read voltages or four read voltages from fifteen read voltages according to the first unit-distance code.

In some examples, the memory cell is a TLC or an MLC and includes three pages or more than four pages. In some examples, selecting the subset of the read voltages includes selecting two read voltages, three read voltages, or more than four read voltages from eight read voltages or more than fifteen read voltages according to the first unit-distance code.

In some examples, the memory cell includes a floating gate configuration or a replacement gate configuration.

In some examples, the first unit-distance code and the second unit-distance code include a Gray code.

Figure 8:
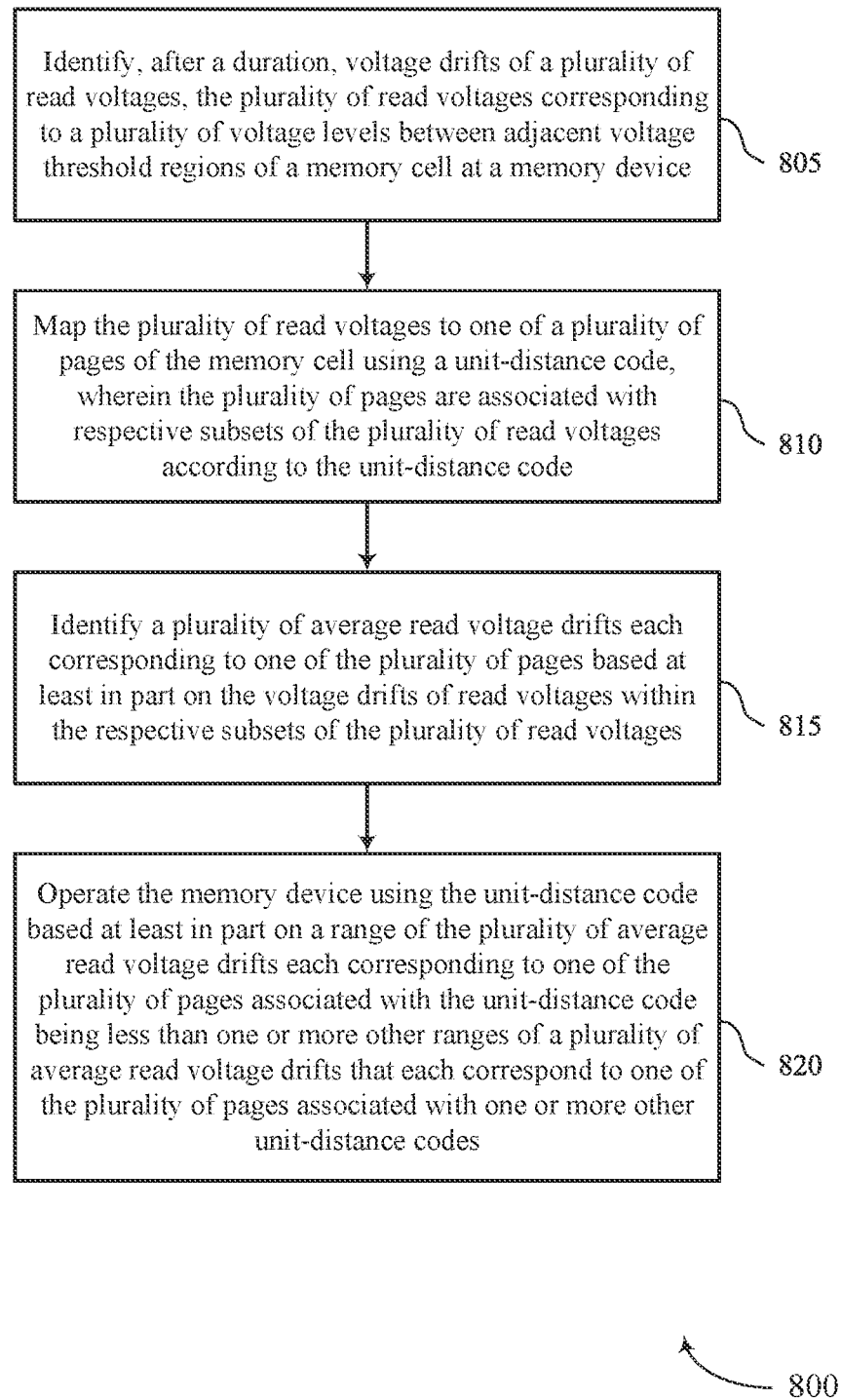
FIGS. 8 and 9 show flowcharts illustrating a method or methods that support coding to decrease error rate discrepancy between pages in accordance with examples as disclosed herein.

FIG. 8 shows a flowchart illustrating a method 800 that supports coding to decrease error rate discrepancy between pages in accordance with examples as disclosed herein. The operations of method 800 may be implemented by a manufacturing system or its components as described herein. For example, the operations of method 800 may be performed by a manufacturing system as described with reference to FIGS. 1 through 6. In some examples, a manufacturing system may execute a set of instructions to control the functional elements of the device to perform the described functions. Additionally, or alternatively, the manufacturing system may perform aspects of the described functions using special-purpose hardware.

At 805, the method may include identifying, after a duration, voltage drifts of a plurality of read voltages, the plurality of read voltages corresponding to a plurality of voltage levels between adjacent voltage threshold regions of a memory cell at a memory device. The operations of 805 may be performed in accordance with examples as disclosed herein. In some examples, aspects of the operations of 805 may be performed by a read voltage drift identifier 625 as described with reference to FIG. 6.

At 810, the method may include mapping the plurality of read voltages to one of a plurality of pages of the memory cell using a unit-distance code, where the plurality of pages are associated with respective subsets of the plurality of read voltages according to the unit-distance code. The operations of 810 may be performed in accordance with examples as disclosed herein. In some examples, aspects of the operations of 810 may be performed by a unit-distance code mapper 630 as described with reference to FIG. 6.

At 815, the method may include identifying a plurality of average read voltage drifts each corresponding to one of the plurality of pages based at least in part on the voltage drifts of read voltages within the respective subsets of the plurality of read voltages. The operations of 815 may be performed in accordance with examples as disclosed herein. In some examples, aspects of the operations of 815 may be performed by a page voltage drift identifier 635 as described with reference to FIG. 6.

At 820, the method may include operating the memory device using the unit-distance code based at least in part on a range of the plurality of average read voltage drifts each corresponding to one of the plurality of pages associated with the unit-distance code being less than one or more other ranges of a plurality of average read voltage drifts that each correspond to one of the plurality of pages associated with one or more other unit-distance codes. The operations of 820 may be performed in accordance with examples as disclosed herein. In some examples, aspects of the operations of 820 may be performed by a unit-distance code selector 640 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for identifying, after a duration, voltage drifts of a plurality of read voltages, the plurality of read voltages corresponding to a plurality of voltage levels between adjacent voltage threshold regions of a memory cell at a memory device; mapping the plurality of read voltages to one of a plurality of pages of the memory cell using a unit-distance code, where the plurality of pages are associated with respective subsets of the plurality of read voltages according to the unit-distance code; identifying a plurality of average read voltage drifts each corresponding to one of the plurality of pages based at least in part on the voltage drifts of read voltages within the respective subsets of the plurality of read voltages; and operating the memory device using the unit-distance code based at least in part on a range of the plurality of average read voltage drifts each corresponding to one of the plurality of pages associated with the unit-distance code being less than one or more other ranges of a plurality of average read voltage drifts that each correspond to one of the plurality of pages associated with one or more other unit-distance codes.

Aspect 2: The method, apparatus, or non-transitory computer-readable medium of aspect 1, further including operations, features, circuitry, logic, means, or instructions, or any combination thereof for mapping the plurality of read voltages to one of the plurality of pages of the memory cell using a second unit-distance code different than the unit-distance code, where the plurality of pages are associated with respective second subsets of the plurality of read voltages according to the second unit-distance code; identifying a plurality of second average read voltage drifts each corresponding to one of the plurality of pages based at least in part on the voltage drifts of each read voltage within the respective second subsets of the plurality of read voltages; and selecting to operate the memory device using the unit-distance code based at least in part on a second range of the plurality of second average read voltage drifts being greater than range of the plurality of average read voltage drifts, where operating the memory device is based at least in part on the selecting.

Aspect 3: The method, apparatus, or non-transitory computer-readable medium of aspect 2, further including operations, features, circuitry, logic, means, or instructions, or any combination thereof for comparing the second range of the plurality of second average read voltage drifts to the range of the plurality of average read voltage drifts, where mapping the plurality of read voltages to one of the plurality of pages of the memory cell using the unit-distance code is based at least in part on the second range of the second average read voltage drift exceeding the range of the plurality of average read voltages.

Aspect 4: The method, apparatus, or non-transitory computer-readable medium of any of aspects 1 through 3, further including operations, features, circuitry, logic, means, or instructions, or any combination thereof for performing summation operations on the voltage drifts of the read voltages within the respective subsets of the plurality of read voltages to identify composite voltage drifts each corresponding to one of the plurality of pages, where identifying the plurality of average read voltage drifts is based at least in part on performing the summation operations.

Aspect 5: The method, apparatus, or non-transitory computer-readable medium of aspect 4, where identifying the plurality of average read voltage drifts further includes operations, features, circuitry, logic, means, or instructions, or any combination thereof for dividing each of the composite voltage drifts by a quantity of the read voltages in the respective subsets of the plurality of read voltages.

Aspect 6: The method, apparatus, or non-transitory computer-readable medium of any of aspects 1 through 5, further including operations, features, circuitry, logic, means, or instructions, or any combination thereof for programming a plurality of memory cells at the memory device and increasing a temperature of the memory device for the duration, where identifying the voltage drift of the plurality of read voltages is based at least in part on increasing the temperature of the memory device for the duration.

Aspect 7: The method, apparatus, or non-transitory computer-readable medium of any of aspects 1 through 6, where the memory cell is a QLC and includes sixteen voltage threshold regions and mapping the plurality of read voltages to one of the plurality of pages includes mapping fifteen read voltages to one of four pages of the memory cell.

Aspect 8: The method, apparatus, or non-transitory computer-readable medium of any of aspects 1 through 7, where the memory cell is a TLC or an MLC and includes eight voltage threshold regions or more than sixteen voltage threshold regions and mapping the plurality of read voltages to one of the plurality of pages includes mapping seven read voltages to one of three pages of the memory cell or mapping more than fifteen read voltages to more than four pages of the memory cell.

Aspect 9: The method, apparatus, or non-transitory computer-readable medium of any of aspects 1 through 8, where the memory cell includes a floating gate configuration or a replacement gate configuration.

Aspect 10: The method, apparatus, or non-transitory computer-readable medium of any of aspects 1 through 9, where the unit-distance code includes a Gray code.

Figure 9:
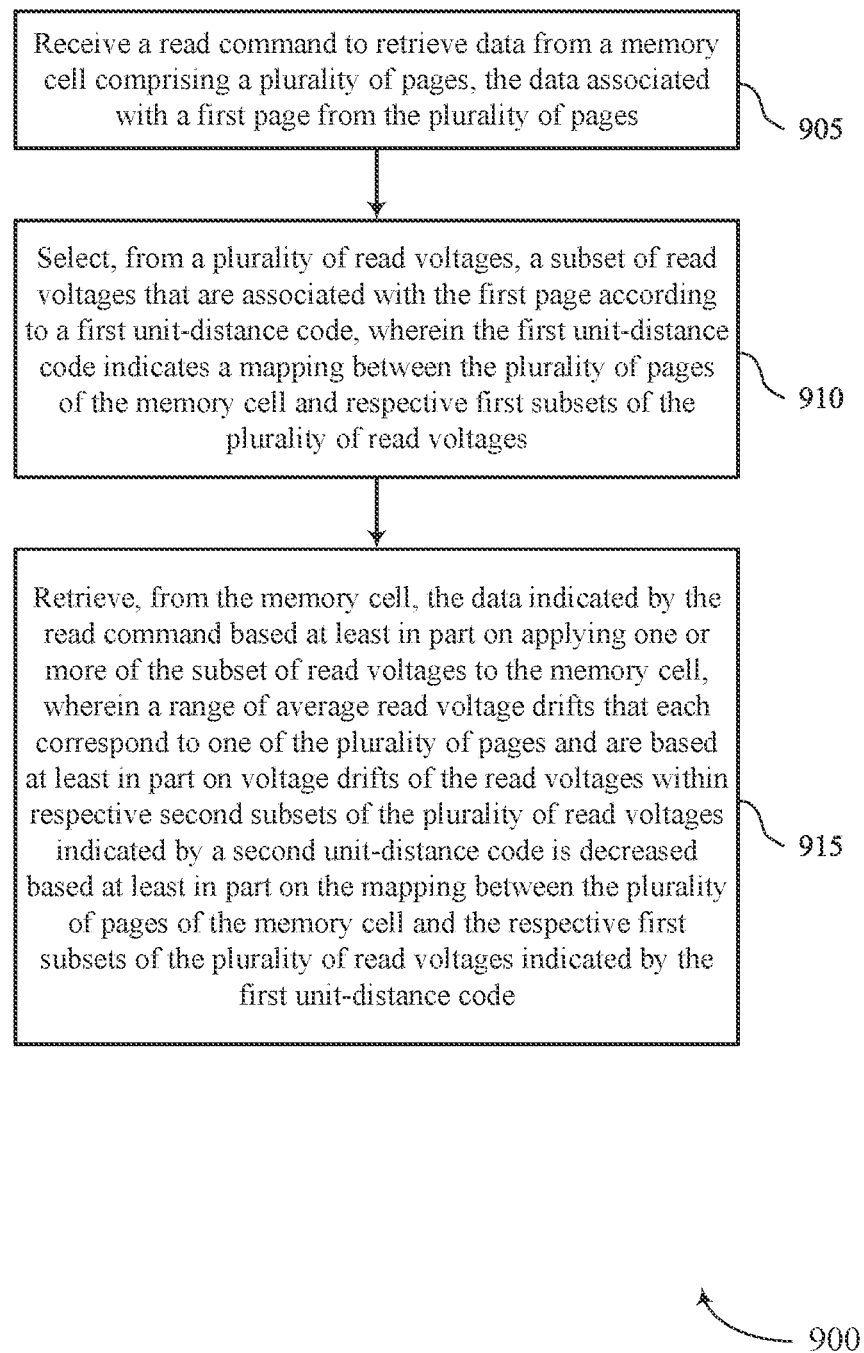

FIG. 9 shows a flowchart illustrating a method 900 that supports coding to decrease error rate discrepancy between pages in accordance with examples as disclosed herein. The operations of method 900 may be implemented by a memory system or its components as described herein. For example, the operations of method 900 may be performed by a memory system as described with reference to FIGS. 1 through 5 and 7. In some examples, a memory system may execute a set of instructions to control the functional elements of the device to perform the described functions. Additionally, or alternatively, the memory system may perform aspects of the described functions using special-purpose hardware.

At 905, the method may include receiving a read command to retrieve data from a memory cell including a plurality of pages, the data associated with a first page from the plurality of pages. The operations of 905 may be performed in accordance with examples as disclosed herein. In some examples, aspects of the operations of 905 may be performed by a read command receiver 725 as described with reference to FIG. 7.

At 910, the method may include selecting, from a plurality of read voltages, a subset of read voltages that are associated with the first page according to a first unit-distance code, where the first unit-distance code indicates a mapping between the plurality of pages of the memory cell and respective first subsets of the plurality of read voltages. The operations of 910 may be performed in accordance with examples as disclosed herein. In some examples, aspects of the operations of 910 may be performed by a read voltage selector 730 as described with reference to FIG. 7.

At 915, the method may include retrieving, from the memory cell, the data indicated by the read command based at least in part on applying one or more of the subset of read voltages to the memory cell, where a range of average read voltage drifts that each correspond to one of the plurality of pages and are based at least in part on voltage drifts of the read voltages within respective second subsets of the plurality of read voltages indicated by a second unit-distance code is decreased based at least in part on the mapping between the plurality of pages of the memory cell and the respective first subsets of the plurality of read voltages indicated by the first unit-distance code. The operations of 915 may be performed in accordance with examples as disclosed herein. In some examples, aspects of the operations of 915 may be performed by a data retriever 735 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for receiving a read command to retrieve data from a memory cell including a plurality of pages, the data associated with a first page from the plurality of pages; selecting, from a plurality of read voltages, a subset of read voltages that are associated with the first page according to a first unit-distance code, where the first unit-distance code indicates a mapping between the plurality of pages of the memory cell and respective first subsets of the plurality of read voltages; and retrieving, from the memory cell, the data indicated by the read command based at least in part on applying one or more of the subset of read voltages to the memory cell, where a range of average read voltage drifts that each correspond to one of the plurality of pages and are based at least in part on voltage drifts of the read voltages within respective second subsets of the plurality of read voltages indicated by a second unit-distance code is decreased based at least in part on the mapping between the plurality of pages of the memory cell and the respective first subsets of the plurality of read voltages indicated by the first unit-distance code.

Aspect 12: The method, apparatus, or non-transitory computer-readable medium of aspect 11, where the plurality of read voltages are each associated with a voltage drift after a duration and a second range of second average read voltage drifts that each correspond to one of the plurality of pages and are based at least in part on the voltage drifts of the read voltages within the respective first subsets of the plurality of read voltages is less than the range of average read voltage drifts that are based at least in part on the voltage drifts of the read voltages within the respective second subsets of the plurality of read voltages.

Aspect 13: The method, apparatus, or non-transitory computer-readable medium of any of aspects 11 through 12, further including operations, features, circuitry, logic, means, or instructions, or any combination thereof for receiving second data for storage in the memory cell; mapping the second data to a voltage threshold region of the memory cell using the first unit-distance code; and writing the data to the plurality of pages in the memory cell based at least in part on mapping the data to the voltage threshold region using the first unit-distance code.

Aspect 14: The method, apparatus, or non-transitory computer-readable medium of any of aspects 11 through 13, where for the first unit-distance code and the second unit-distance code, a one-bit change occurs in data stored by only one of the plurality of pages between a representation of data stored by adjacent voltage threshold regions of the memory cell.

Aspect 15: The method, apparatus, or non-transitory computer-readable medium of any of aspects 11 through 14, where the memory cell is a QLC and includes four pages and selecting the subset of the read voltages includes selecting three read voltages or four read voltages from fifteen read voltages according to the first unit-distance code.

Aspect 16: The method, apparatus, or non-transitory computer-readable medium of any of aspects 11 through 15, where the memory cell is a TLC or an MLC and includes three pages or more than four pages and selecting the subset of the read voltages includes selecting two read voltages, three read voltages, or more than four read voltages from eight read voltages or more than fifteen read voltages according to the first unit-distance code.

Aspect 17: The method, apparatus, or non-transitory computer-readable medium of any of aspects 11 through 16, where the memory cell includes a floating gate configuration or a replacement gate configuration.

Aspect 18: The method, apparatus, or non-transitory computer-readable medium of any of aspects 11 through 17, where the first unit-distance code and the second unit-distance code include a Gray code.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    identifying, after a duration, voltage drifts of a plurality of read voltages, the plurality of read voltages corresponding to a plurality of voltage levels between adjacent voltage threshold regions of a memory cell at a memory device;
    mapping the plurality of read voltages to one of a plurality of pages of the memory cell using a unit-distance code, wherein the plurality of pages are associated with respective subsets of the plurality of read voltages according to the unit-distance code;
    identifying a plurality of average read voltage drifts each corresponding to one of the plurality of pages based at least in part on the voltage drifts of read voltages within the respective subsets of the plurality of read voltages; and
    operating the memory device using the unit-distance code based at least in part on a range of the plurality of average read voltage drifts each corresponding to one of the plurality of pages associated with the unit-distance code being less than one or more other ranges of a plurality of average read voltage drifts that each correspond to one of the plurality of pages associated with one or more other unit-distance codes.

2. The method of claim 1, further comprising:
    mapping the plurality of read voltages to one of the plurality of pages of the memory cell using a second unit-distance code different than the unit-distance code, wherein the plurality of pages are associated with respective second subsets of the plurality of read voltages according to the second unit-distance code;
    identifying a plurality of second average read voltage drifts each corresponding to one of the plurality of pages based at least in part on the voltage drifts of each read voltage within the respective second subsets of the plurality of read voltages; and
    selecting to operate the memory device using the unit-distance code based at least in part on a second range of the plurality of second average read voltage drifts being greater than range of the plurality of average read voltage drifts, wherein operating the memory device is based at least in part on the selecting.

3. The method of claim 2, further comprising:
    comparing the second range of the plurality of second average read voltage drifts to the range of the plurality of average read voltage drifts, wherein mapping the plurality of read voltages to one of the plurality of pages of the memory cell using the unit-distance code is based at least in part on the second range of the plurality of second average read voltage drifts exceeding the range of the plurality of average read voltage drifts.

4. The method of claim 1, further comprising:
    performing summation operations on the voltage drifts of the read voltages within the respective subsets of the plurality of read voltages to identify composite voltage drifts each corresponding to one of the plurality of pages, wherein identifying the plurality of average read voltage drifts is based at least in part on performing the summation operations.

5. The method of claim 4, wherein identifying the plurality of average read voltage drifts further comprises:
    dividing each of the composite voltage drifts by a quantity of the read voltages in the respective subsets of the plurality of read voltages.

6. The method of claim 1, further comprising:
    programming a plurality of memory cells at the memory device; and
    increasing a temperature of the memory device for the duration, wherein identifying the voltage drifts of the plurality of read voltages is based at least in part on increasing the temperature of the memory device for the duration.

7. The method of claim 1, wherein:
    the memory cell is a quad-level cell (QLC) and comprises sixteen voltage threshold regions; and
    mapping the plurality of read voltages to one of the plurality of pages comprises mapping fifteen read voltages to one of four pages of the memory cell.

8. The method of claim 1, wherein:
    the memory cell is a tri-level cell (TLC) or a multi-level cell (MLC) and comprises eight voltage threshold regions or more than sixteen voltage threshold regions; and
    mapping the plurality of read voltages to one of the plurality of pages comprises mapping seven read voltages to one of three pages of the memory cell or mapping more than fifteen read voltages to more than four pages of the memory cell.

9. The method of claim 1, wherein the memory cell comprises a floating gate configuration or a replacement gate configuration.

10. The method of claim 1, wherein the unit-distance code comprises a Gray code.

11. A method, comprising:
    operating a memory device using a first unit-distance code that indicates a mapping between a plurality of pages of a memory cell and respective first subsets of a plurality of read voltages;
    receiving a read command to retrieve data from the memory cell, the data associated with a first page from the plurality of pages;
    selecting, from the plurality of read voltages, a second subset of the plurality of read voltages that are associated with the first page according to a second unit-distance code, wherein the second unit-distance code indicates a mapping between the plurality of pages of the memory cell and respective second subsets of the plurality of read voltages; and retrieving, from the memory cell, the data indicated by the read command based at least in part on applying one or more of the second subset of the plurality of read voltages to the memory cell, wherein a range of average read voltage drifts that each correspond to one of the plurality of pages and is based at least in part on voltage drifts of the read voltages within respective first subsets of the plurality of read voltages indicated by the first unit-distance code is greater than a range of average read voltage drifts that each correspond to one of the plurality of pages and is based at least in part on voltage drifts of the read voltages within respective second subsets of the plurality of read voltages indicated by the second unit-distance code.

12. The method of claim 11, wherein:
the plurality of read voltages are each associated with a voltage drift after a duration.

13. The method of claim 11, further comprising:
receiving second data for storage in the memory cell;
mapping the second data to a voltage threshold region of the memory cell using the second unit-distance code; and
writing the data to the plurality of pages in the memory cell based at least in part on mapping the data to the voltage threshold region using the second unit-distance code.

14. The method of claim 11, wherein for the first unit-distance code and the second unit-distance code, a one-bit change occurs in data stored by only one of the plurality of pages between a representation of data stored by adjacent voltage threshold regions of the memory cell.

15. The method of claim 11, wherein:
the memory cell is a quad-level cell (QLC) and comprises four pages; and
selecting the second subset of the plurality of read voltages comprises selecting three read voltages or four read voltages from fifteen read voltages according to the second unit-distance code.

16. The method of claim 11, wherein:
the memory cell is a tri-level cell (TLC) or a multi-level cell (MLC) and comprises three pages or more than four pages; and
selecting the second subset of the plurality of read voltages comprises selecting two read voltages, three read voltages, or more than four read voltages from eight read voltages or more than fifteen read voltages according to the second unit-distance code.

17. The method of claim 11, wherein the memory cell comprises a floating gate configuration or a replacement gate configuration.

18. The method of claim 11, wherein the first unit-distance code and the second unit-distance code comprise a Gray code.

19. A memory system, comprising:
one or more memory devices comprising a plurality of memory cells, the plurality of memory cells each comprising a plurality of pages; and
processing circuitry coupled with the one or more memory devices and configured to cause the memory system to:
operate the one or more memory devices using a first unit-distance code that indicates a mapping between the plurality of pages of a memory cell of the plurality of memory cells and respective first subsets of a plurality of read voltages;
receive a read command to retrieve data from the memory cell of the plurality of memory cells, the data associated with a first page from the plurality of pages;
select, from the plurality of read voltages, a second subset of the plurality of read voltages that are associated with the first page according to a second unit-distance code, wherein the second unit-distance code indicates a mapping between the plurality of pages of the memory cell and respective second subsets of the plurality of read voltages; and
retrieve, from the memory cell, the data indicated by the read command based at least in part on applying one or more of the second subset of the plurality of read voltages to the memory cell, wherein a range of average read voltage drifts that each correspond to one of the plurality of pages and is based at least in part on voltage drifts of the read voltages within respective first subsets of the plurality of read voltages indicated by the first unit-distance code is greater than a range of average read voltage drifts that each correspond to one of the plurality of pages and is based at least in part on voltage drifts of the read voltages within respective second subsets of the plurality of read voltages indicated by the second unit-distance code.

20. The memory system of claim 19, wherein:
the plurality of read voltages are each associated with a voltage drift after a duration.

21. The memory system of claim 19, wherein the processing circuitry is further configured to cause the memory system to:
receive second data for storage in the memory cell;
map the second data to a voltage threshold region of the memory cell using the second unit-distance code; and
write the data to the plurality of pages in the memory cell based at least in part on mapping the data to the voltage threshold region using the second unit-distance code.

22. The memory system of claim 19, wherein for the first unit-distance code and the second unit-distance code, a one-bit change occurs in data stored by only one of the plurality of pages between a representation of data stored by adjacent voltage threshold regions of the memory cell.

23. The memory system of claim 19, wherein:
the memory cell is a quad-level cell (QLC) and comprises four pages; and
selecting the second subset of the plurality of read voltages comprises selecting three read voltages or four read voltages from fifteen read voltages according to the second unit-distance code.

24. The memory system of claim 19, wherein:
the memory cell is a tri-level cell (TLC) or a multi-level cell (MLC) and comprises three pages or more than four pages; and
selecting the second subset of the plurality of read voltages comprises selecting two read voltages, three read voltages, or more than four read voltages from eight read voltages or more than fifteen read voltages according to the second unit-distance code.

25. The memory system of claim 19, wherein the memory cell comprises a floating gate configuration or a replacement gate configuration.

* * * * *